United States Patent [19]
Lin et al.

[11] Patent Number: 6,103,581
[45] Date of Patent: Aug. 15, 2000

[54] METHOD FOR PRODUCING SHALLOW TRENCH ISOLATION STRUCTURE

[75] Inventors: Chung-Te Lin, Tainan, Taiwan; Chin-Hsiung Ho, Sunnyvale, Calif.; Hann-Huei Tsai, Taipei, Taiwan

[73] Assignee: Taiwan Semiconductor Manufacturing Company, Hsin-Chu, Taiwan

[21] Appl. No.: 09/200,552

[22] Filed: Nov. 27, 1998

[51] Int. Cl.[7] .................................................. H01L 21/76
[52] U.S. Cl. ........................ 438/296; 438/404; 438/424
[58] Field of Search ................................... 438/424, 296, 438/404

[56] References Cited

U.S. PATENT DOCUMENTS

| | | | |
|---|---|---|---|
| 5,192,706 | 3/1993 | Rodder | 437/67 |
| 5,369,052 | 11/1994 | KenKare et al. | 437/70 |
| 5,395,790 | 3/1995 | Lur | 437/69 |
| 5,521,422 | 5/1996 | Mandelman et al. | |
| 5,702,977 | 12/1997 | Jang et al. | 437/67 |
| 5,926,717 | 7/1999 | Michael et al. | |
| 5,930,646 | 7/1999 | Gerung et al. | |
| 6,022,789 | 2/2000 | Takase | |

*Primary Examiner*—John F. Niebling
*Assistant Examiner*—Josetta A. Jones
*Attorney, Agent, or Firm*—George O. Saile; Stephen B. Ackerman; Wolmar J. Stoffel

[57] ABSTRACT

A method for fabricating shallow trench isolation stricture wherein a surface oxide layer and a polycrystalline silicon buffer layer are formed on a semiconductor body. Openings are formed through the layers and into the body that constitute trenches. A lining oxide layer is formed on the trench and buffer layer surfaces. A thick oxide layer is deposited on the body to fill the trench, and the layer planarized by chemical-mechanical polishing. The exposed portions of the buffer layer are removed and the horizontal surface oxide layer portions removed by anisotropic etching.

15 Claims, 4 Drawing Sheets

METHOD FOR PRODUCING SHALLOW TRENCH ISOLATION STRUCTURE

BACKGROUND OF THE INVENTION

1. Field of the Invention

The present invention relates generally to methods for filling shallow trenches with trench fill layers within integrated circuits. More particularly, the present invention relates to methods for filling shallow isolation trenches with trench fill dielectric layers within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

In integrated circuit technology, it is necessary to separate the active regions containing active devices from one another. In early bipolar integrated circuits, the active regions were generally electrically isolated from each other by PN junctions. However, with increasing demand for higher device densities, it has become necessary to reduce the isolation areas.

As integrated circuit device dimensions have decreased, it has become increasingly common within advanced integrated circuit technology to employ trench isolation methods, such as shallow trench isolation methods, and recessed oxide isolation methods, to form trench isolation regions nominally coplanar with adjoining active semiconductor regions of semiconductor substrates. Trench isolation regions nominally coplanar with active semiconductor regions within semiconductor substrates are desirable since they optimize, when subsequently forming patterned layers upon those nominally coplanar trench isolation regions and active semiconductor regions, the limited depth of focus typically achievable with advanced photo exposure tooling.

Various techniques are known to produce trench isolation. U.S. Pat. Nos. 5192,706 and 5702,977 describe techniques for fabricating trench structures. these patents are primarily concerned with preserving a planar top surface configuration when the sizes of the trench structures vary widely in size. U.S. Pat. No. 5,521,422 describes in detail the parasitic leakage problem associated with very small trench isolation structures, and proposes structures for reducing leakage.

In very small semiconductor geometries, junction leakage seems to play a dominate killer for 0.18 um CMOS and beyond. For this reason it is important to develop new trench isolation structures and methods of fabrication that will eliminate or reduce the leakage associated with present structures.

SUMMARY OF THE INVENTION

Accordingly, it is an object of this invention to provide a new method of fabricating a integrated circuit semiconductor device with trench filled isolation structure that has no or reduced parasitic current leakage.

Another object of the invention is to provide a new method of fabricating trench filled isolation structure which results in a thin oxide spacer that prevents lateral wet etching of the trench structure during subsequent process operations.

Yet another object of the invention is to provide a new method of fabricating shallow trench isolation structure that reduces, or prevents, current leakage in junction isolation when using Ti/Co Salicide processing.

The present invention of a method to fabricate an improved trench isolation structure for integrated circuit devices starts by forming a surface oxide layer on the top surface of a monocrystalline semiconductor body. A non-crystalline silicon buffer layer is formed over the oxide layer and openings formed through the layers and into the body that define trenches that surround selected areas of the body. A lining oxide layer is formed on the trench surfaces and the buffer layer. A thick silicon oxide layer is anisotropically deposited on the body to fill the trenches and cover the buffer layer. A chemical-mechanical polishing procedure is applied to the body which removes the oxide layer to a level above the surface of surface oxide layer. The exposed buffer layer portions are removed and the underlying surface oxide layer removed with an anisotropic etch, leaving thin oxide layer spacer portions that surround the trench fill.

DETAILED DESCRIPTION OF THE PREFERRED EMBODIMENTS

The present invention provides a method of forming a shallow trench isolation structure for an integrated circuit device, wherein the parasitic junction leakage normally present in such structures is avoided or reduced, particularly when the Ti/Co salicid process is used to fabricate the metallurgy. Further, the process produces an essentially stress-free trench isolation structure and provides a thin oxide spacer that projects above the semiconductor body surface, which avoids the formation of a notch formation adjacent the corner of the isolated portions of the semiconductor body.

Figure 1:
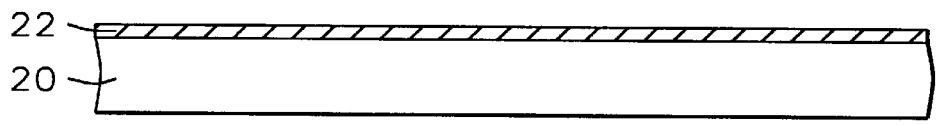
FIGS. 1 through 10 is a sequence of cross sectional views, in enlarged scale, that illustrate the process steps of the method of the invention.
Figure 2:
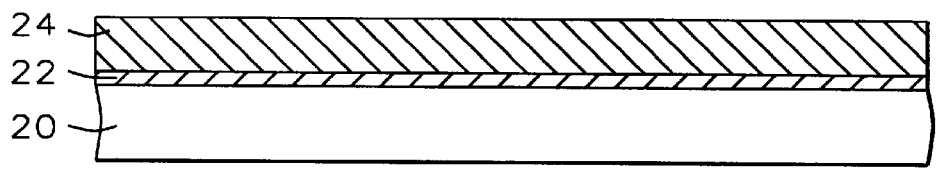
Figure 3:
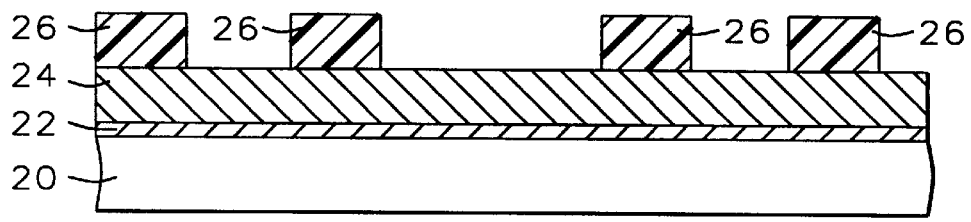
Figure 4:
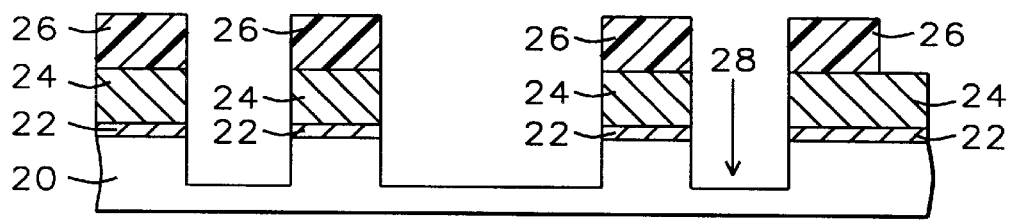
Figure 5:
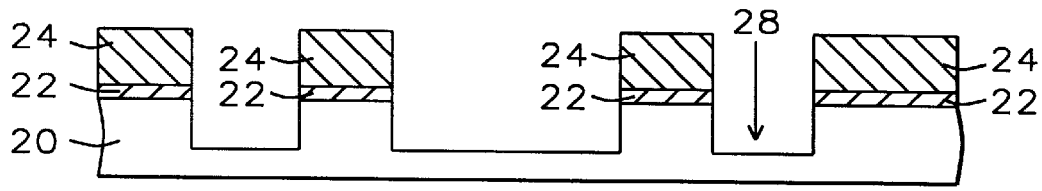

Referring now to the Figures of the drawing, and FIG. 1 in particular, there is shown a monocrystalline semiconductor body 20, preferably silicon, that will ultimately have fabricated thereon an integrated circuit device. As indicated in block 60 of FIG. 11, a thin surface oxide layer 22 is formed on the top surface of body 20. The layer 22 is preferably a silicon oxide layer that is formed by thermally oxidizing silicon body 20. Layer 22 has a suitable thickness, preferably in the range of 100 to 200 angstroms. A non-crystalline silicon layer 24 is deposited on layer 22, as shown in FIG. 2, and as indicated by block 62 in FIG. 11. Any suitable technique can be used to deposit layer 24, for example chemical vapor deposition, which is well known in the art. The thickness of layer 24 is preferably in the range of 1000 to 2000 angstroms. A masking photoresist layer 26 is then deposited on layer 24, which is exposed to a pattern, and cured to define the trenches that will surround selected areas of body 20 that will ultimately become the wells which will contain active and passive devices. This device structure is illustrated in FIG. 3, and indicated in block 64 of FIG. 11. As shown in FIG. 4, the exposed layers 22 and 24, and portions of body 20 are anisotropically etched to form trench openings 28. The process step is indicated by block 66 of FIG. 11. The photo resist layer 2¡6 is shown removed in FIG. 5. The trenches preferably have a depth in the range of 1000 to 2000 angstroms into the body 20.

Figure 6:
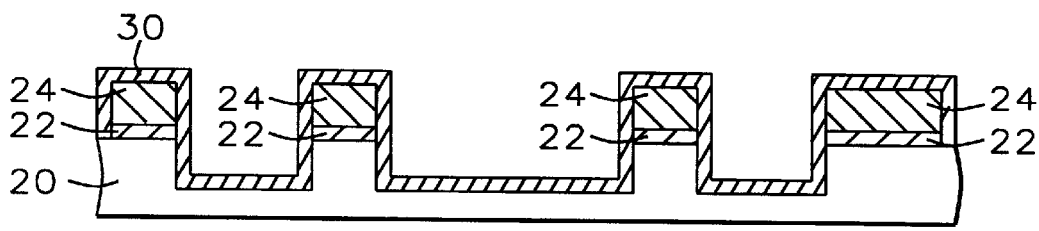
Figure 11:
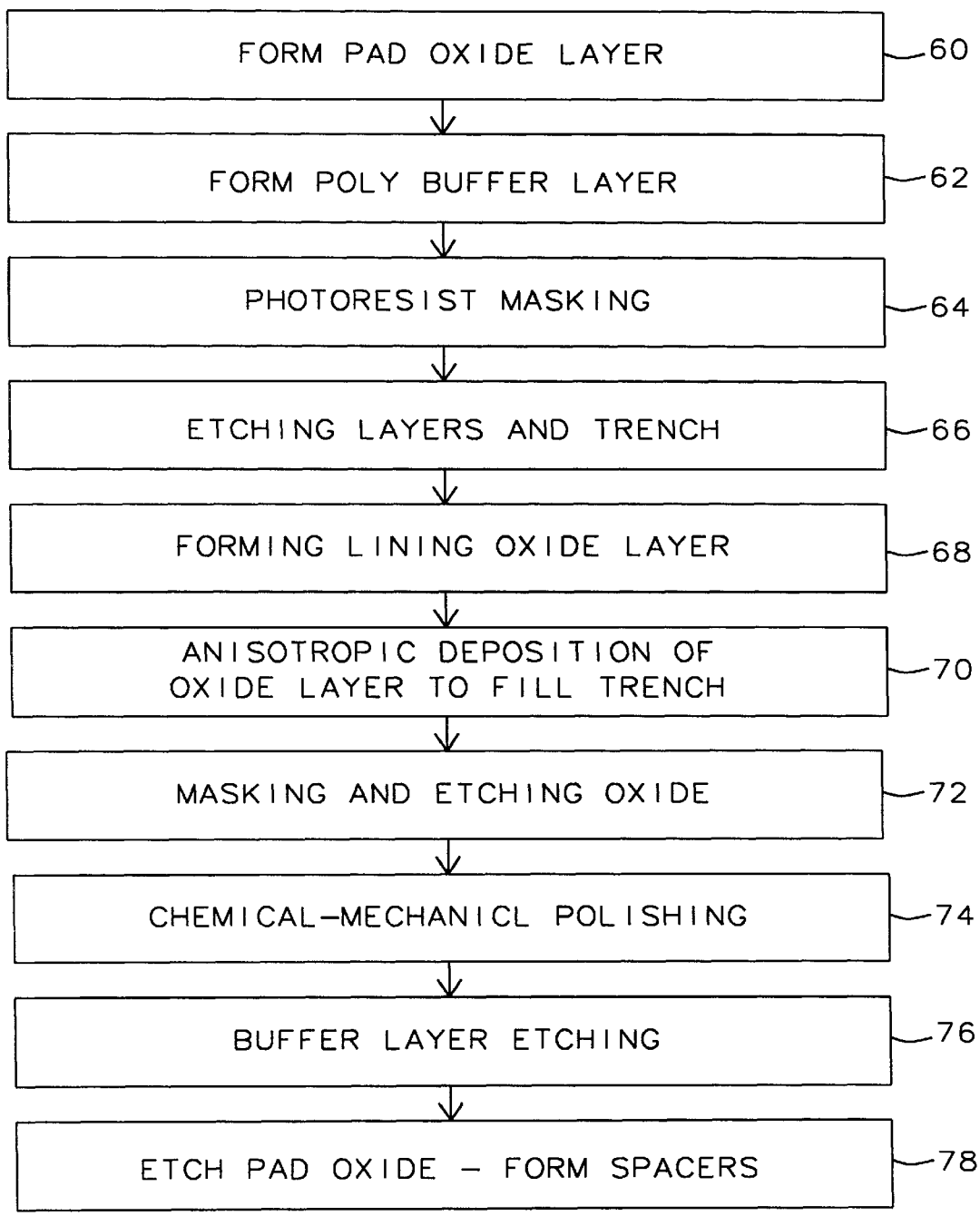
FIG. 11 is a block diagram that lists the steps of the process.

As shown in FIG. 6, and indicated by block 68 of FIG. 11, a lining oxide layer 30 is formed on the surfaces of the trench openings and on the side surfaces and top surfaces of layer 24. The layer 30 is formed by thermally oxidizing the body 20. A thermal oxide layer will form on trench surfaces of silicon body and on the side and top surfaces of polysilicon layer 24.

Figure 7:
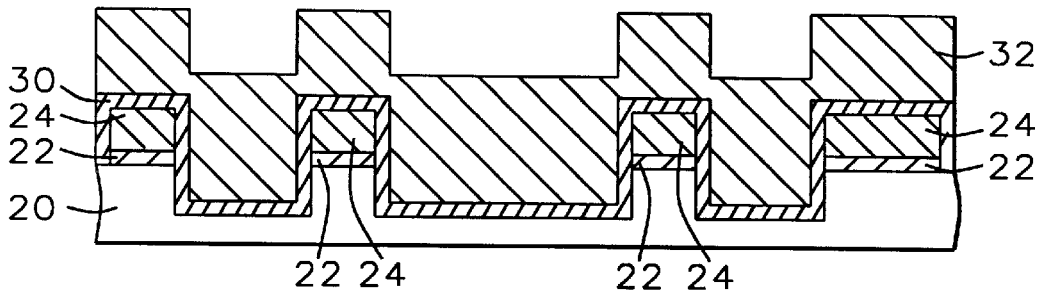

As shown in FIG. 7, a relatively thick oxide layer 32 is deposited over layer 30 to a depth to completely fill the trench openings. This step is indicated by block 70 of FIG. 11. Layer 32 is preferably anisotropically deposited on layer 30 using HDP CVD, or SA CVD techniques, which are well known. This results in a very uneven top surface as indicated in FIG. 7. The unevenness can be reduced by masking the body with a reverse mask of the mask used to form the trenches, and etch the protruding portions of layer 32. This is an optional step, indicated by block 72, that will enhance the top planarity of the top surface when the layer is polished in the next step.

Figure 8:
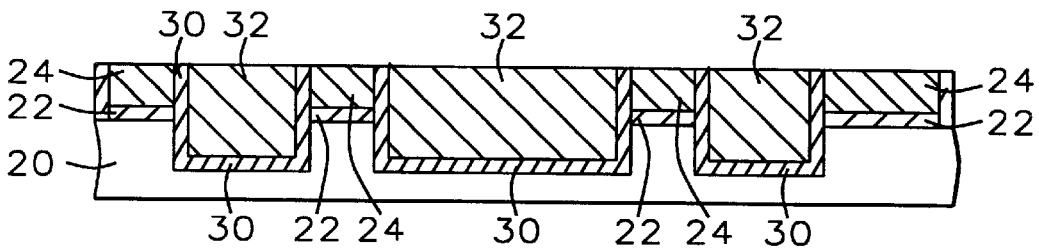
Figure 9:
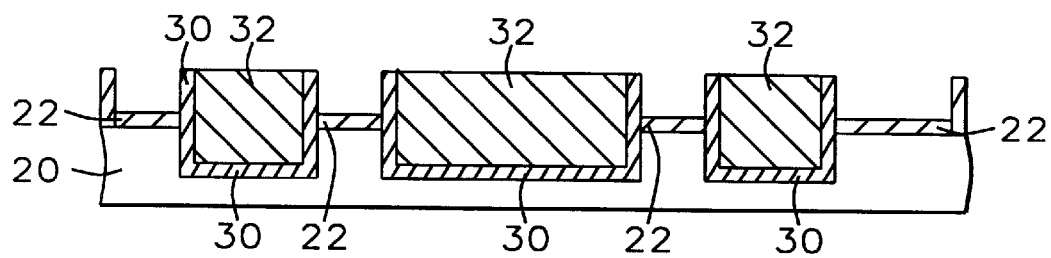

Layer 32 and also buffer layer 24 are subjected to a chemical-mechanical polish (CMP) planarizing procedure, as shown in FIG. 8, and indicated in block 74 of FIG. 11. the CMP procedure will remove the portions of layer 30 overlying layer portions 24 and preferably some of the top portions of buffer layer 24. Preferably the CMP will leave the level of the oxide 32 that is about 300 to 6000 angstroms above the top surface of body 20.

Figure 10:
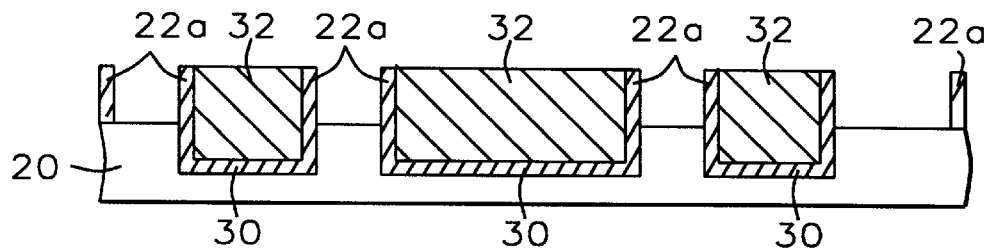

As shown in FIG. 10, the exposed portions of surface oxide layer 22 are removed with an anistropic etch. This will also take a thin layer, equal to the thickness of the later 22, off the top of projection oxide spacer layers 22*a*. However, most of the layer remains since its upward length is much greater that the thickness. This step ;is indicated in block 78 of FIG. 11.

The invention is not to be construed as limited to the particular forms described herein, since these are to be regarded as illustrative rather than restrictive. The invention is intended to cover all processes which do not depart from the spirit and scope of the invention.

We claim:

1. A method for isolating selected areas on an integrated circuit semiconductor device with trench filled isolation structures having reduced edge leakage comprising;

forming a a surface oxide layer on a top surface of a monocrystalline semiconductor body;

forming a non-crystalline silicon buffer layer on the top surface of said surface oxide layer;

anisotropically forming openings said non-crystalline silicon layer and said surface oxide layer and forming underlying trenches around selected areas in said semiconductor body;

forming a lining oxide layer on the surfaces of said trenches, on the side walls of said openings in said moncrystalline layer, and on the remaining top surface of said moncrystalline silicon layer;

filling said trenches and covering said moncrystalline silicon buffer layer with an anisotropically deposited second sillcon oxide layer;

removing portions of said second oxide layer and portions of said moncrystalline silicon layer by chemical mechanical polish planarizing to a level above the surface of said surface oxide layer, leaving a portion of said overlying monocrystalline silicon layer;

selectively removing the exposed silicon layer thereby exposing the underlying surface oxide layer; and anisotropically removing the exposed surface oxide layer portions on said semiconductor body.

2. The method of claim 1 wherein portions of said second silicon oxide layer is removed with a reverse mask followed by an etch that selectively removes the upper portions of the oxide layer over the moncrstalline silicon layer.

3. The method of claim 1 wherein said surface oxide layer is thermally grown on the top surface of said semiconductor body to a thickness in the range 100 to 200 angstroms.

4. The method of claim 1 wherein said moncrystalline silicon buffer layer is a polycrystalline silicon layer.

5. The method of claim 4 wherein said buffer layer has a thickness in the range of 1000 to 2000 angstroms.

6. The method of claim 1 wherein said openings in said moncrystalline buffer layer and the forming on trenches is achieved by depositing a photo resist layer on the moncrystalline silicon buffer layer with an anti reflective coating, exposing and curing the resist, and anisotropically removing the resultant exposed buffer layer and the underlying semiconductor body material.

7. The method of claim 6 wherein said trenches have a depth in the range of 6000 to 8000 angstroms.

8. The method of claim 1 wherein said lining oxide layer is formed by thermal oxidation of the semiconductor body and the moncrystalline silicon buffer layer.

9. The method of claim 8 wherein said lining oxide layer has a thickness in the range of 200 to 350 angstroms.

10. The method of claim 1 wherein said second silicon oxide layer is formed with high density plasma enhanced chemical vapor deposition.

11. The method of claim 10 wherein the thickness of said second silicon oxide layer in said trenches is in excess of the depth of the trenches.

12. The method of claim 8 wherein the top surface of said second silicon oxide layer in said trenches is higher than the top surface of said surface oxide layer by a thickness in the range of 300 to 600 angstroms.

13. The method of claim 1 wherein the removal of the moncrystalline silicon buffer layer remaining after chemical mechanical polishing is achieved by anistropic sputter etching.

14. The method of claim 13 wherein the resultant exposed surface oxide layer, after removal of the buffer layer, is removed by anisotropic sputter etching.

15. The method of claim 1 wherein upwardly extending oxide spacers protruding above the surface of the monocrystalline semiconductor body surround the trench isolation structures to reduce parasitic leakage at the interface of the said selected monocrystalline areas in said semiconductor body.

* * * * *